United States Patent
Trygstad

(10) Patent No.: US 10,235,481 B2
(45) Date of Patent: Mar. 19, 2019

(54) SYSTEM AND METHOD FOR ONLINE MEASUREMENT OF VAPOR PRESSURE IN HYDROCARBON PROCESS STREAMS

(71) Applicant: Yokogawa Corporation of America, Sugar Land, TX (US)

(72) Inventor: W. Marcus Trygstad, Spring, TX (US)

(73) Assignee: Yokogawa Corporation of America, Sugarland, TX (US)

( * ) Notice: Subject to any disclaimer, the term of this patent is extended or adjusted under 35 U.S.C. 154(b) by 0 days.

(21) Appl. No.: 15/616,552

(22) Filed: Jun. 7, 2017

(65) Prior Publication Data

US 2017/0269559 A1    Sep. 21, 2017

Related U.S. Application Data

(63) Continuation-in-part of application No. 14/173,301, filed on Feb. 5, 2014.

(60) Provisional application No. 62/346,914, filed on Jun. 7, 2016.

(51) Int. Cl.
    *G06F 17/50*    (2006.01)
    *G01V 11/00*    (2006.01)

(52) U.S. Cl.
    CPC .......... *G06F 17/5009* (2013.01); *G01V 11/00* (2013.01)

(58) Field of Classification Search
    None
    See application file for complete search history.

(56) References Cited

U.S. PATENT DOCUMENTS

| | | |
|---|---|---|
| 4,344,485 A | 8/1982 | Butler |
| 4,886,590 A | 12/1989 | Tittle |
| 5,260,865 A | 11/1993 | Beauford et al. |
| 5,322,626 A | 6/1994 | Frank et al. |
| 5,402,333 A | 3/1995 | Cardner |

(Continued)

FOREIGN PATENT DOCUMENTS

| | | |
|---|---|---|
| EP | 327 463 A1 | 6/2011 |
| WO | WO2000/22489 | 4/2000 |
| WO | WO2001/59534 | 8/2001 |

OTHER PUBLICATIONS

International Search Rpt., dated Aug. 16, 2017, Yokogawa Corp of America.

(Continued)

*Primary Examiner* — Tuan C Dao
(74) *Attorney, Agent, or Firm* — Davis, Malm & D'Agostine, P.C.; Richard L. Sampson

(57) ABSTRACT

A system and method for determining the vapor pressure of a process stream includes a hard analyzer configured to measure one or more dependent variables associated with a sample of the process stream, where a dependent variable is also a property of the sample such as vapor pressure; a sensor system comprising one or more sensors configured to capture one or more independent process variables associated with the process stream; an aggregation module for collecting and storing outputs from the hard analyzer and responses from the sensor system; and a modeling module capable of generating a vapor pressure model from the same. The system then applies the model to sensor responses for the process stream to generate vapor pressure values.

54 Claims, 2 Drawing Sheets

System Overview

(56) References Cited

U.S. PATENT DOCUMENTS

| | | | |
|---|---|---|---|
| 5,968,312 A * | 10/1999 | Sephton | B01D 1/065 |
| | | | 159/18 |
| 7,082,348 B1 | 7/2006 | Dahlquist et al. | |
| 8,005,645 B2 | 8/2011 | Emigholz et al. | |
| 8,036,760 B2 | 10/2011 | Mehta et al. | |
| 2002/0170550 A1 * | 11/2002 | Mitsutani | F02D 41/0042 |
| | | | 123/674 |
| 2003/0147351 A1 * | 8/2003 | Greenlee | G05B 17/02 |
| | | | 370/232 |
| 2004/0140095 A1 | 7/2004 | Vinegar | |
| 2008/0082302 A1 | 4/2008 | Samardziji | |
| 2009/0093892 A1 | 4/2009 | Kant | |
| 2009/0319070 A1 | 12/2009 | Morningred | |
| 2010/0191361 A1 | 7/2010 | McCready | |
| 2010/0204925 A1 | 8/2010 | Albahri | |
| 2010/0224365 A1 | 9/2010 | Abad | |
| 2010/0228485 A1 | 9/2010 | Betancourt et al. | |
| 2011/0111509 A1 * | 5/2011 | Trygstad | G01N 21/359 |
| | | | 436/55 |
| 2011/0276169 A1 | 11/2011 | Bourg, Jr. | |
| 2012/0022670 A1 | 1/2012 | Boe et al. | |
| 2012/0325751 A1 | 12/2012 | Renick et al. | |
| 2014/0090454 A1 | 4/2014 | Surman et al. | |
| 2014/0309756 A1 | 10/2014 | Trygstad | |
| 2015/0211971 A1 | 7/2015 | Little, III et al. | |

OTHER PUBLICATIONS

Supplemental Intl Search Rpt., dated May 2, 2017, Yokogawa Corp of America.

Backx, T. et al.,"Integration of Model Predictive Control and Optimization of Processes", Aachen, Germany, Jan. 2000, pp. 2-13.

Pearson, Ronald K. "Outliers in Process Modeling and Identification", IEEE Transactions on Control Systems Technology, New York, U.S., vol. 10, No. 1, pp. 55.

* cited by examiner

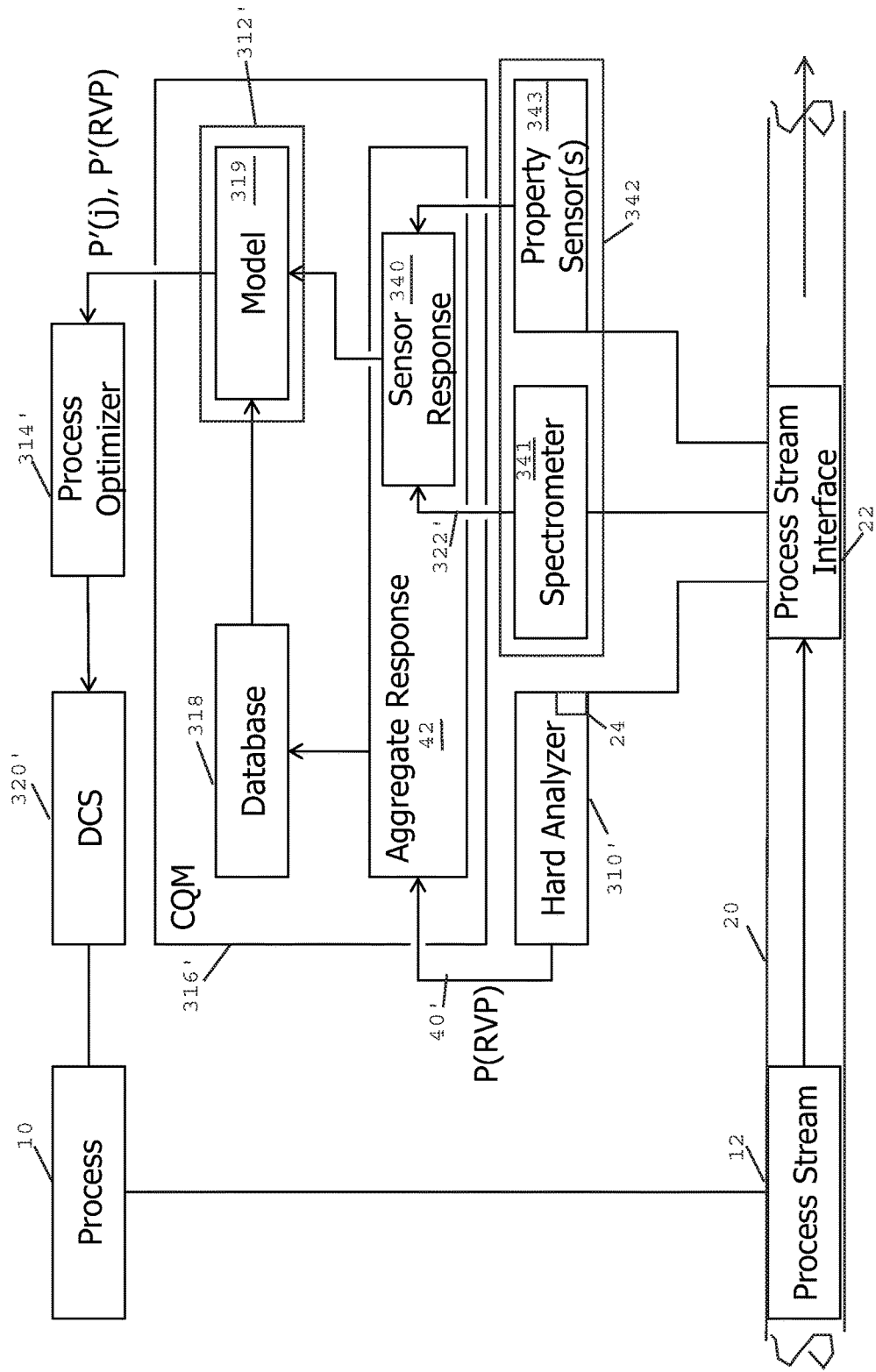
Fig. 1. System Overview

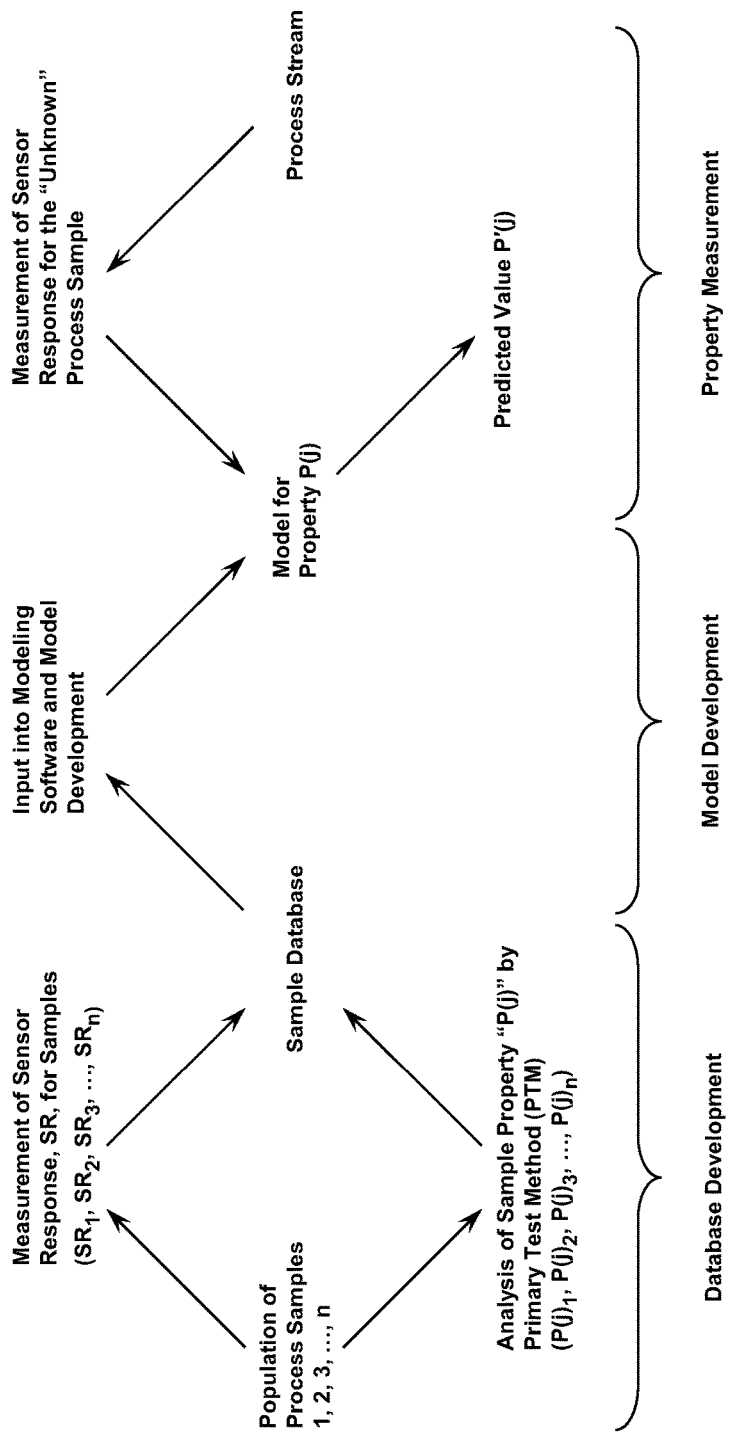
Figure 2. "Prediction Supply Chain"

SYSTEM AND METHOD FOR ONLINE MEASUREMENT OF VAPOR PRESSURE IN HYDROCARBON PROCESS STREAMS

RELATED APPLICATION

This application claims the benefit of U.S. Provisional Patent Application Ser. No. 62/346,914, entitled System and Method for High-Accuracy, High-Frequency Online Measurement of RVP in Finished Hydrocarbon Products such as Gasoline and in Upstream Petroleum Products such as Condensate and Crude Oil, filed on Jun. 7, 2016, and is a Continuation-In-Part of U.S. patent application Ser. No. 14/173,301, entitled System, Method and Apparatus for Determining Properties of Product or Process Streams, filed on Feb. 5, 2014, which claims the benefit of U.S. Provisional Patent Application Ser. No. 61/760,879, entitled System, Method and Apparatus for Determining Properties of Product or Process Streams, filed on Feb. 5, 2013, the contents all of which are incorporated herein by reference in their entirety for all purposes.

TECHNOLOGICAL FIELD

The present invention generally relates to a system, method, and apparatus of estimating properties of hydrocarbon streams. In particular, the systems, methods, and apparatuses of the present invention relate to measuring properties of hydrocarbon streams with high frequency and a high degree of accuracy.

BACKGROUND INFORMATION

The operations of process plants have been leveraged by the availability of analytical methods, for example, through the use of laboratory measurements or online analyzers. These types of results are valued by plant operations because they are typically regarded as reliable. For example, with respect to hydrocarbon and/or refining operations, primary test methods (PTMs) provide a critical basis for custody transfer of products whose properties have been ascertained in accordance with industry standard test methods such as those developed and promulgated by ASTM International.

Notwithstanding the importance of these PTMs, they do suffer from certain inadequacies. For example, laboratory measurements typically may be available only once or several times per day. Furthermore, several hours can elapse between the obtaining of a discrete sample and the reporting of results from tests performed on it, severely limiting the possibility to control the process on the basis of those results. Additionally, sample stability, sample contamination, issues of representative sampling, and uncertainty associated with the execution of test procedures may result in erroneous sample values being returned.

Improving the availability, integrity, and reproducibility of test data has in many cases motivated the on-line deployment of measurements. Yet, depending upon the type of measurement and analysis being performed, the cycle time for online analyzers may be on the order of ten or more minutes and, in some cases, up to and over one hour, which, in some cases, may still be inadequate for purposes of maximizing process efficiency or product quality.

Process industries have conventionally responded to the time delay issues and reliability of primary measurements by instituting secondary measurement techniques capable of predicting properties of certain process streams. Such secondary techniques commonly have included the use of some form of model, for example, multivariate statistical models capable of predicting certain properties of interest using process inputs, in which the properties of interest may be termed "dependent variables" and the process inputs may be termed "independent variables."

An important class of these model-based approaches is "inferential analyzers," also referred to as "soft sensors" because they typically reside in software. Soft sensors are appealing for at least two reasons. First, many times they do not require the installation of additional sensors in the process unit because they typically rely upon measurements such as temperature, pressure, and flow rate, which may already be available. Second, with the advent of distributed control systems, the input measurements typically relied upon by soft sensors are substantially available in real-time, having discrete sampling rates of one second or even less. These advantages at least address the disadvantage of time delay associated with primary measurements by providing property predictions at intervals that are greater than those typically required by process control systems. Additionally, they obviate the need to physically obtain a sample, eliminating the issues of representative sampling and sample integrity.

While the fidelity of these models may be quite good over limited time periods ranging from a few hours to even perhaps a few days, conventional inferential analyzers tend to be insufficiently robust because in aggregate the independent variables that serve as inputs into the model typically relate to the chemistry of the process stream both indirectly and incompletely. They are indirect expressions of the chemistry to the extent that the readings of sensors on the process are functions of both process conditions and material in the process; they are incomplete insofar as the number of independent variables used in the models is fewer than the degrees of freedom in the system, which relate to both the process system and the material being processed through it. But an exception may occur when steady-state or quasi-steady-state conditions prevail and many process and stream variables are nominally constant, e.g. when feed quality and the operation of the process system are substantially invariant. At such times, the independent variables may "determine" stream chemistry in the mathematical sense, and property predictions by an inferential analyzer may be extremely reliable. Yet, a fundamental issue is that models generally are correlative, and because correlation does not necessarily denote cause, inferential models may be largely empirical, with first principles having only distant influence. Indeed, the literature freely refers to the modeling approach that is perhaps most common as a "black box method." In summary, property predictions by inferential analyzers are labile to the extent that the effect (a predicted value) is removed from the primary cause (a stream property that ultimately is determined by sample chemistry).

The preceding, general discussion finds specific relevance where the PTM is realized with a "hard" analyzer that measures the vapor pressure of a hydrocarbon sample; the sensor is a spectrometer based on a molecular spectroscopy technique; and the soft (inferential) analyzer is a model applied to the spectrum of the sample measured by the spectrometer. The common practice is to periodically update the model to overcome its inaccuracies resulting from a variety of variables including but not limited to changes in (i) the range of possible feed compositions and properties; (ii) the proportions of feed streams being combined into the product being monitored; and (iii) product property specifications. Yet, model updates are after the fact, typically being done when vapor pressure predictions are shown to be inaccurate. The corollary is that in any given moment, the validity an inferential prediction may be quite uncertain, and may in fact lack the required accuracy.

Even small inaccuracies in knowledge of vapor pressure in hydrocarbon streams can significantly impact the economies of production for large-scale processes similar to those process units found in petroleum refineries and other hydrocarbon processing operations. The need therefore exists in the art for improved methods for achieving and validating vapor pressure measurement with a high degree of accuracy, preferably on-line in substantially real-time, despite the aforementioned changes in operating conditions that can undermine the reliability of current methods, both hard and soft.

BRIEF SUMMARY OF EXEMPLARY EMBODIMENTS

An aspect of the invention includes a system for determining the vapor pressure of a process stream. The system includes a hard analyzer configured to generate values for vapor pressure of a sample of the fluid process stream at time increments t1, t2, . . . tn. One or more sensors generate one or more outputs in the form of independent variables for a sample of the fluid process stream at the time increments. A cognitive quality manager (CQM) coupled to the hard analyzer and the one or more sensors includes an aggregation module that captures and aggregates the one or more outputs and the values generated by the hard analyzer, to form an aggregated response. The CQM uses the aggregated response to generate a model relating the one or more outputs to the values generated by the hard analyzer. The CQM also applies the model to the one or more outputs to generate a predicted value of vapor pressure of a sample of the fluid process stream at times tx between the time increments.

Another aspect of the invention includes a method for determining vapor pressure of a process stream using the aforementioned system.

These embodiments of the invention and other aspects and embodiments of the invention will become apparent upon review of the following description taken in conjunction with the accompanying drawings. The invention, though, is pointed out with particularity by the appended claims.

BRIEF DESCRIPTION OF THE SEVERAL VIEWS OF THE DRAWING

Having thus described the invention in general terms, reference will now be made to the accompanying drawing, and wherein:

FIG. 1 is a functional block diagram of an embodiment of the present invention including steps of predicting a property using a model-based soft analyzer, and updating the model in conjunction with a hard analyzer; and FIG. 2 is a flowchart showing steps for model development and property prediction through application of a property model, that may be used with embodiments of the present invention.

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

As used in the specification and in the appended claims, the singular forms "a", "an", and "the" include plural referents unless the context clearly indicates otherwise. For example, reference to "an analyzer" includes a plurality of such analyzers. In another example, reference to "an analysis" includes a plurality of such analyses.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, the term "hard analyzer" refers to an analyzer, including online or offline laboratory based devices, capable of substantially directly sensing and measuring a value for a particular property associated with a process stream and/or a sample of the process stream. These measured properties are referred to as "dependent variables." Examples of dependent variables may include concentrations of components in the sample and characteristics of the sample including "hot properties" such as flash point and distillation properties, or cold properties such as cloud point, freezing point, cold filter plugging point, and pour point of diesel. Examples of these analyzers include, respectively, the FPA-4, DPA-4, CPA-4, FRP-4, CFPP-4.2, and the PPA-4 available from Bartec Benke GmbH (Hamburg, Germany), while the GC8000 online GC from Yokogawa Electric Corporation (Tokyo, Japan) may be used to perform a simulated distillation (simdist) analysis. The terms "primary measurement", "measurement", "property values", and "dependent variables" refer to the output of a hard analyzer. These measurements or dependent variables may be the result of a single analysis or the average of a plurality of analyses. As used herein, the terms "inferential analyzer" and "soft sensor" refer to a computer-implemented model that operates on various independent variables captured by one or more sensors to infer values for various properties of a process fluid corresponding to those which otherwise may be measured by a hard analyzer. Examples of independent variables include process pressure, temperature, and flow inputs to a DCS (Distributed Control System), and intensity responses in the spectrum of a process sample recorded with a spectrometer. These inferred properties are also referred to as "predicted dependent variables", "inferential" or "model-based" measurements, "properties of interest", or simply "predictions". An example of an "inferential analyzer" that may be used in embodiments of the present invention includes property models developed by means of Pirouette® multivariate modeling program from InfoMetrix, Inc. (Seattle, Wash.).

As used herein, a "process stream" or "process fluid" is any stream or fluid associated with a process. In non-limiting examples, process streams include any intermediate process stream of a process within a process plant. As used herein, a "product stream" or "product fluid" is a process stream that is the output from an operating unit within a production process and may be the feed to another operating unit or may substantially become the basis for a product produced by a process plant. However, a "product stream," which is a more limiting case of a process stream may still encompass process streams that may be subjected to further modification by other processing units or blending within a tank or a blender, for example, to provide the desired properties of the finished product. The methods and systems of the invention are intended to pertain to all process streams and all product streams, which may be a more limiting class of process streams. In certain embodiments, the methods and systems of the invention may be applied to the finished product itself.

The terms "computer" and "end-user device" are meant to encompass a workstation, personal computer, personal digital assistant (PDA), wireless telephone, or any other suitable computing device including a processor, a computer readable medium upon which computer readable program code (including instructions and/or data) may be disposed, and a user interface. The term 'real time' refers to sensing and responding to external events nearly simultaneously (e.g., within milliseconds or microseconds) with their occurrence, or sufficiently fast to enable the device to keep up with an external process. In the context of process control, the frequency of "real-time" data is defined in terms relative, not absolute. Thus, for a process in which significant changes can occur in time frames on the order of a few minutes, new analytical results that are available every half minute are, from the viewpoint of process control, real-time. So is a measurement time interval of 5 minutes when significant process variations occur in time frames longer than 10-15 minutes. For the purpose of optimizing operation of a refinery gasoline blending operation, analysis results every 30-60 seconds are real time.

The terms "DCS" and "Distributed Control System" refer to a computer-implemented process control system such as the Centum VP™ commercially available from Yokogawa Electric Corporation.

The availability of information substantially in real-time for properties of process streams, such as continuous process streams in chemical and petrochemical processing, hydrocarbon processing, and refining operations may many times be important to maximizing throughput, controlling product quality, and/or ensuring that operations of the process plant are environmentally sound and safe.

The inventor has conceived of systems and methods for determining properties of process streams. In an embodiment of the invention, the process streams may be hydrocarbon process streams. In certain embodiments of the invention, the systems and methods of the invention may be used to determine a property or properties of a product stream. The systems and methods, according to certain embodiments of the invention, provide measurements frequently and with a high degree of accuracy.

Exemplary embodiments described hereinbelow may be applied for the purpose of exploiting the strengths of, and also overcoming the weaknesses of both hard and soft analyzers, where a hard analyzer is a device that measures a value $P(j)$ for some property j of a sample by fundamental means while a soft analyzer employs a mathematical model or algorithm to infer a value $P'(j)$ for the same property. A hard analyzer provides primary or first-principle results whereas those from a soft analyzer may be described as being secondary, inferential, or predicted. More specifically, soft analyzer predictions of values $P'(j)$ are based on the response measured by one or more sensors, which is characteristic of the sample but is not the property j. The model then serves to convert that response into the value $P'(j)$. Inasmuch as the response is one or more sensor outputs that are effectively independent of the property j of interest, they are "independent variables", which hereinafter will be referred to interchangeably as "sensor responses" or "sensor response" without any implication whatsoever concerning the number of independent variables or sensors. In particular embodiments of the present invention, the Cognitive Quality Manager (CQM) integrates both as depicted in FIG. 1 to provide substantially real-time property measurement of the vapor pressure of hydrocarbon mixtures whereby strengths of a hard analyzer directly mitigate weaknesses of the soft analyzer and vice versa.

A principal strength of a hard analyzer is that it obtains a value $P(j)$ for a material as a first-principles signal from a physico-mechanical mechanism or device. Although the output may be conditioned by the application of some basic mathematical function that may involve calibration against some standard, key characteristics of the signal generated by hard analyzers include it being proportional to and substantially selective toward the property j while also being substantially insensitive to other properties of the material analyzed. Importantly, hard analyzers are in many cases the subject of efforts by the ASTM Committee D02 on Petroleum Products and Lubricants which develops, statistically characterizes, and promulgates standard test methods (ASTM methods), the methods being referred to as Primary Test Methods (PTMs) and measurements made with them being referred to as Primary Test Method Results (PTMRs). Because the calibration of a PTM, and the reproducibility and repeatability of its PTMR is defined in the corresponding ASTM method, measurements executed in accordance with the method often are the basis for material certification in connection with custody transfer.

Limitations of hard analyzers may, by way of example, include (a) long analysis cycle times relative to the frequency that would be optimal for purposes of enabling process control and optimization; (b) consequential delay in issuance by the hard analyzer of a measurement result, which may necessitate reconciliation with the true process timeline; (c) hysteresis that occurs within the analyzer sensor or system when consecutive samples analyzed are dissimilar; (d) limited possibility to improve measurement precision by statistical means because of the aforementioned long analysis cycle times and also because the analyzer generates a univariate response to a sample that is temporally and physically discrete; (d) complications and resulting maintenance related to the behavior of the sample under conditions of analysis, including but not limited to fouling or plugging of the analyzer apparatus by the sample; (e) the cost of implementing multiple hard analyzers of a particular type to monitor multiple streams; and (f) complications related to the application of a single hard analyzer to monitor a plurality of streams, including but not limited to the switching between the streams, delays in the transport of the same from the process sample tap to the analyzer, delays in reporting results for one stream while measurements are made on others, and hysteresis that occurs within the analyzer sensor or system when properties of the streams are dissimilar.

Strengths of a soft analyzer relate principally to three factors: immediacy, representativeness, and multiplicity. Immediacy concerns the speed and frequency of prediction, which are high compared with the rate at which changes occur in the process being monitored and also the analysis cycle time of most hard analyzers. Representativeness and multiplicity are consequences of immediacy, the former concerning the possibility to obtain a plurality of results in short time frames and the latter being the characteristic whereby a soft analyzer may be configured to monitor concurrently or in rapid succession a plurality of properties and/or a plurality of streams. An important benefit of representativeness is the possibility to improve precision by statistical means, which include the application of averaging or damping functions to consecutive results for a sample stream. Furthermore, multivariate regression techniques that in some embodiments may be used to create inferential models have been shown to be extremely effective in filtering imprecisions associated with PTMRs and sensor responses in the database used in model development depicted in FIG. 2, the filtering being a benefit of relating the PTMRs and responses by statistical means such that uncertainty in model predictions may be greater than about 80% lower than the uncertainty of the reference method (Trygstad et al., ISA 2015).

A main weakness of a soft analyzer is that it does not actually measure the property of interest. Instead, it predicts a property by applying some mathematical function $f$, which is a model, to a sensor response that is not the property of interest but the output of one or more sensors communicably coupled to the process or the process stream. As will be discussed in greater detail below, the soft analyzer in some embodiments applies a correlation between values for the property of interest and independent variables, which are sensor responses. Thus, $$P'(j) = f(\text{sensor response}) \quad (1)$$

where P'(j) denotes that the value P(j) is predicted, and f denotes a function applied to the sensor response to obtain P'(j), which function is a model created and applied by a procedure such as that depicted in FIG. 2, the procedure being the prediction supply chain. The sensor response may be regarded as comprising one or more variables that are not the PTMR measured by the hard analyzer, P(j), which therefore are sometimes called independent variables. Given that the analysis is the application of the model to the sensor response, as used herein, the soft analyzer includes the model and a processor configured to use the model to correlate the sensor responses to the properties of interest. The soft analyzer should not be confused with the sensor responses themselves, which serve as inputs to the soft analyzer. The term soft analyzer (sometimes referred to as soft sensor) applies because the analyzer-model is created and applied digitally by means of a computer program, whether implemented in software or firmware. But the term soft also applies figuratively because predictions by soft analyzers are not solid in the sense that they generally lack the robustness of hard analyzers because sensor response does not in the limit account for all chemistry that underlies a given property, where the terms robust and robustness as used herein refer to the quality wherein prediction accuracy achieved within some defined, initial time frame remains substantially unchanged over time despite process changes and the accompanying changes in chemistry of the stream being monitored.

The PTM and soft analyzer differ in two important respects: the former relies on a physical device that directly measures the property of interest whereas the latter includes a mathematical function applied to independent variables from one or more sensors; and their outputs are, respectively, a first-principles measurement and a prediction, which is an inferential prediction. Furthermore, PTMs covered by ASTM methods are used broadly to certify product quality for custody transfer but, for reasons enumerated hereinabove, may not always be amenable to facile online implementation for process monitoring. By contrast, the general lack of ASTM sanction for soft analyzers does not preclude their use in process monitoring and control. Because they can take the place of hard analyzers in such applications, they may be aptly called surrogate sensors.

Hard and soft analyzers applied to measure the vapor pressure of petroleum streams and products may exhibit all of the weaknesses enumerated hereinabove. Typically, the hard analyzer is a commercially-available device that performs the automatic, unattended, online determination of vapor pressure in accordance with a standard method such as an ASTM method. In effect, it is an automated version of a conventional laboratory analyzer, engineered for unattended, repetitive execution of the ASTM method. The soft analyzers render predictions of vapor pressure by means of inferential spectrometry, the soft analyzer including a multivariate model, running on suitable processing means, that is applied to sample spectra measured by some particular molecular spectroscopy technique such as near-infrared (NIR), mid-infrared (FTIR), Raman, and nuclear magnetic resonance (NMR). The combining of multivariate modeling methods with molecular spectroscopy techniques is well known in many industries and has been practiced in the refining industry for several decades to predict properties of hydrocarbon mixtures including gasoline and diesel. Often referred to as chemometrics, software packages suitable for making multivariate property models are widely available, being offered by both spectrometer suppliers and third parties, Pirouette® being an exemplary chemometric program distributed globally. Thus, $$P'(\text{vapor pressure}) = f(\text{sample spectrum}) \quad (2)$$

which denotes that a mathematical function $f$, which is a model applied to the sample spectrum to obtain a predicted value for vapor pressure, P'(vapor pressure). But, the instant inventor has recognized that contrary to conventional wisdom, a spectrum of a complex liquid hydrocarbon mixture obtained by conventional molecular spectroscopy techniques often is not a unique expression of the sample's chemical composition. The reason, detailed elsewhere (Trygstad and Horgen, ISA 2014) is that the spectroscopy underdetermines the chemistry: changes in chemical composition do not necessarily produce corresponding, unique changes in sample spectra. In mathematical terms, the reason is that sample composition, which is responsible for the magnitude of the property of interest, has more degrees of freedom than do the corresponding sample spectra. Understood in chemical terms, the large diversity of hydrocarbon molecules in a mixture is achieved by combining a relatively small number of building blocks called functional groups, just as several dozen words can be assembled using only the first five letters of the alphabet. Continuing the analogy, techniques such as infrared (IR), near-infrared (NIR), Raman, and nuclear magnetic resonance (NMR) spectroscopy record responses for letters or groups of adjoined letters but in the limit cannot pick out each whole word in a mixture containing different amounts of all those words spelled using a-e. This limitation comes into play as a function of increasing molecular weight (the word length).

More problematically, and as discussed more fully elsewhere (Trygstad, et al., ISA 2015), changes in concentrations of components that produce meaningful changes in vapor pressure may not produce corresponding, measureable changes in spectra of complex petroleum mixtures such as gasoline, crude oil, and the like.

The problem is not that compounds with highest vapor pressure, and therefore contribute most strongly to RVP, do not in their pure form exhibit spectral responses. Rather, the spectral changes that accompany changes in RVP may be lost amidst the aggregate responses for all compounds in the mixture, meaning that they may be below the detection limit of the molecular spectroscopy technique. Nor is the problem that multivariate correlations cannot be created. Indeed, because hydrocarbon processing operations such as petroleum refineries are constrained and highly integrated, physically and economically, correlations exist between product quality and composition such that multivariate spectrometric models can inevitably be obtained even for properties that have no basis in spectroscopy such as distillation yield temperature or parts per million of elemental sulfur. But such correlations are circumstantial, being rooted not in first principles but in underlying conditions that often are completely undiscernible or unknown, hence the maxim that correlation does not imply causation. A well-known issue with soft analyzers generally, it is particularly egregious in inferential spectrometry which commonly fails to achieve predictions that have the measurement reliability of the PTMs they aim to replace. Vapor pressure (herein referred to as RVP) prediction by spectrometric surrogacy accordingly lacks predictive robustness across changing chemical composition that attends changing process conditions, the pervasive requirement being therefore that those who practice it often must devote significant, ongoing effort to update, tune, or revise property models. Commonly referred to as remodeling or recalibration, such effort tends to restore the quality of predictions by the models in many applications, yet the remodeling cycle has two inherent uncertainties: the reliability of a prediction at any given moment; and the determination of when that reliability has degraded to the point that requires remodeling. Typically, the latter can only be ascertained by statistical comparison of results with those generated through regular analysis by the PTM.

Therefore, a need exists in the art for an approach to analyzing vapor pressure that overcomes weaknesses enumerated hereinabove for both hard and soft analyzers while also offering characteristics corresponding to their respective strengths. Accordingly, as shown in FIG. 1, particular embodiments of the instant invention accomplish this by means of the CQM 316', which integrates hard and soft analyzers 310' and 312', respectively, through technology fusion to provide high-accuracy, substantially real-time online measurements in which the property of interest is the vapor pressure of a hydrocarbon (HC) process stream; the process 10 is any operation designed to obtain, handle, transport, or modify the HC process stream 12; the hard analyzer 310' is communicably coupled to the process stream via process stream interface 22, and in particular embodiments the analyzer 310' includes an internal sample cell equipped with a pressure sensor 24 so as to permit the first-principles measurement of the pressure exerted by the vapor of a sample from the process, P(vapor pressure). The soft analyzer 312' includes a model 319 that infers vapor pressure values for a sample of the process stream, P'(vapor pressure), when it is applied to the sensor response 340 obtained from one or more sensors 342 communicably coupled to a sample of the process, e.g., at interface 22, which one or more sensors do not include that which measures P(vapor pressure), by a PTM. As discussed in greater detail hereinbelow, sensors 342 may include any one or more of a spectrometer 341, and property sensors 343 which may include one or more univariate property sensors and/or a gas chromatograph (GC). It should be noted that process stream interface 22 includes any number of interfaces by which a sensor and/or hard analyzer may be communicably coupled to a process stream, including a conventional sample cell, flow path, sample receptacle, and/or one or more direct insertions into the process stream to obtain in situ readings. Moreover, although shown and described primarily with respect to a substantially continuous flow process stream 12, it should be recognized that embodiments of the present invention may be operated in stopped-flow mode without departing from the scope of the invention.

The term Vapor Pressure is used herein consistently with its conventional definition, to very generally refer to the pressure exerted above the surface of a sample of a HC mixture by components in the mixture. More particularly, as used herein, vapor pressure is the pressure exerted by vapor phase hydrocarbons in thermodynamic equilibrium with the liquid HC mixture from which they originate, when the vapor and liquid are contained in a closed container, are at the same temperature, and the vapor-to-liquid ratio is defined and fixed.

The term Process Stream (12) as used herein, refers to, by way of nonlimiting example, a liquid HC mixture that is contained in or is flowing through a process and is selected from a group consisting of: blended gasoline; any of a plurality of blending components used to produce blended gasoline; the output from an operating unit within a refinery, which output is also referred to as the unit rundown or product; the feed to any operating unit in a refinery; volatile petroleum products; crude oil at any point in the supply chain from the wellhead to the refinery crude distillation unit (CDU); and petroleum streams that may be unprocessed, partially processed, fully processed, or blended, and which include crude oil, condensates, distillates, natural gas liquids (NGL), shale oil, and the like; and/or combinations or mixtures thereof.

The term Process (10), as used herein refers to, by way of nonlimiting example, an operation that has one or more purposes selected from a group consisting of: receiving and handling without substantially altering a HC mixture obtained from a well, a pipeline, a rail car, a stationary tank, a truck, or a marine vessel; conveying a HC mixture between the same; modifying the physical properties of the HC mixture, in particular its distillation profile, by means of a distillation column designed to separate components on the basis of boiling point, where the HC mixture is the process feed and the separated components are products; modifying the chemical and/or physical properties of a HC mixture by changing the chemical structure of some or all of the components in the mixture, where the HC mixture is the process feed and the modified mixture is the product; and the combining of a plurality of HC mixtures, which are process feed streams, to obtain one or more product streams whose aggregated physical and/or chemical properties and aggregated value are intermediate between the aggregate of those for the feed streams; and/or combinations or mixtures thereof. A process may comprise a plurality of processes, and when the purpose is the modifying of one or more process streams, the aggregated value of the product stream(s) is in general greater than the aggregated value of the feed stream(s). Controlling vapor pressure is often important for diverse reasons including by way of nonlimiting example pressure limits of vessels used in their containment and pipelines used for their conveyance; requirements for end-use applications such as motor fuels; and environmental regulation. Because the vapor pressure of a given HC mixture depends most strongly on concentrations of its lowest-molecular-weight components, many processes are designed to modify or control concentrations of the same, such modifying or controlling commonly depending on the availability of accurate and substantially real-time information about the vapor pressure of feed and/or product streams.

The term Hard Analyzer (or RVP Analyzer) 310', as used herein, refers to a device that is communicably coupled to the process, e.g., via a process stream interface 22 such as a flow cell, and is configured to capture a sample of the process stream and to then measure and issue a result for vapor pressure in accordance with a standard methodology that includes controlling the relative volumes of the liquid sample received into a sample cell, the headspace in the cell above the liquid, the temperature of the liquid and vapor phases of the sample, and reading the pressure exerted by the vapor phase in the cell by means of a pressure sensor 24. When the method is ASTM D323, the Standard Test Method for Vapor Pressure of Petroleum Products (Reid Method), the vapor pressure is referred to as Reid Vapor Pressure (RVP). Vapor pressure may be measured by other, related ASTM test methods such as D4057, D4953, D5188, D5199, D6377, D6378, D6897, and the like, and also by other standard methods promulgated by ASTM International or by other international agencies and organizations. Hereinafter, vapor pressure will for convenience be referred to as RVP except when otherwise noted, but it will be understood that measurement of vapor pressure by the Reid Method is generally representative of any number of methods for measuring of vapor pressure, and that embodiments of the present invention described hereinafter apply generally to all first-principle methods for measuring the vapor pressure of liquid HC mixtures. An example of a commercial hard analyzer (RVP analyzer) 310' is the Eravap Online (Eralytics GmbH, Vienna, Austria).

The term Soft Analyzer (312'), as used herein, includes a mathematical model 319 running on a suitable processor, configured to predict in substantially real time the RVP value P'(RVP) for a process stream and applied to a sensor response generated by a sensor or a plurality of sensors communicably coupled to the process stream, where the sensor obtains a reading by means other than that described hereinabove for the hard analyzer. Regardless of the modeling algorithm used, the model does not necessarily explain the RVP values in terms of a first-principles relationship to the sensor response, which might be a hard or direct correlation. Rather, the term model applies primarily because the RVP model explains variance in the data set used to create it, meaning that the model accounts for variations in RVP relative to variations in the sensor response. That accounting has its underlying basis in the chemistry of the HC mixture and in the process by which the mixture was produced, but because that basis may be indistinct, weak, circumstantial, or generally not understood or explainable in terms of first principles, the resulting model sometimes may be referred to as a black box model. Thus, the soft analyzer is based on a mathematical function that relates the sensor response to RVP, although that relationship may be only indirectly and incompletely causal due to the aforementioned underdetermination by the sensor response of the underlying chemistry responsible for RVP. As such, the soft analyzer is an inferential analyzer whose mathematical function may be considered to be either soft (not, for example, a hard correlation) or circumstantial, the expression of chemistry responsible for the property of interest being, respectively, direct but indistinct or indirect and indistinct (Trygstad et al., ISA 2016). As shown, embodiments of the invention include a process optimizer 314' configured to use the predicted vapor pressure P'(RVP) to control the process 10, including fluid process stream 12, in real time, e.g., via a digital control system (DCS) 320'.

The term Sensor Response (340), as used herein, which the model 319 receives and transforms into predicted RVP values, P'(RVP), refers to the output from one or more sensors 342 communicably coupled to the process stream, e.g., at a process stream interface 22, by appropriate means known to those skilled in the art that may depend on the particular type of sensor. In particular embodiments, the sensor 342 includes a spectrometer 341 and the process stream interface is a sample flow cell, the spectrometer configured to apply a molecular spectroscopy technique selected from a group consisting of: absorption of mid- or near-infrared electromagnetic radiation and include by way of non-limiting example FTIR, FTNIR, AOTF-NIR, scanning dispersive NIR, diode-array NIR, MEMS-NIR (IR/NIR); Raman-effect scattering (Raman); and nuclear magnetic resonance (NMR). An example of a process FTIR spectrometer is commercially available from (Applied Instrument Technologies, Inc., Upland, Calif. Commercially available examples of the various NIR spectrometer technologies include the QuaslR 2000 FTNIR (Galaxy Scientific, Nashua, N.H.); the PIONIR (Applied Instrument Technologies, Inc.); and the Verax VPA (JP3 Measurement LLC, Austin, Tex.). Examples of process Raman spectrometers include the HyperFlux P.R.O. Plus (Tornado Spectral Systems, Toronto, Ontario) and the PI-200 (Process Instruments, Inc., Salt Lake City, Utah). The MOD-800 MRA (Modcon Systems Ltd., London, England) is an example of a process NMR spectrometer. The sensors 342 may also include one or more property sensors 343, such as GCs or univariate sensors 343 as described in greater detail hereinbelow.

As mentioned above, the sensor response 340 may include a sample spectrum 322' generated by spectrometer 341 and which is obtained by means of a process stream interface 22 which may be an optical device or an ensemble of devices suitable to facilitate a contact between the spectrometer and the sample, where the device may include (i) a probe inserted into a flowing sample stream, or (ii) a cell, which is also a flowcell, wherethrough a sample of the process stream may flow to effect contact with electromagnetic radiation employed for spectroscopy. In a particular embodiment, the cell is an optical cell optically coupled to a Raman spectrometer, an NIR spectrometer, or an FTIR spectrometer, which acquires the spectrum 322' of a discrete sample obtained in the cell in a stopped-flow mode effected by a sample shutoff valve (not shown) located after the outlet from the cell. In another particular embodiment, the spectrometer acquires the spectrum of a sample obtained in a continuous-flow mode, in which case the resulting spectrum is that corresponding to a discrete sample whose volume is equal to r×t where r=[sample flow rate through the cell] and t=[time required to acquire the sample spectrum] and the recorded spectrum is the average spectrum corresponding to a time t/2 after beginning spectral acquisition. Variation in sample temperature may cause subtle changes in spectral features that may not be easily distinguished from, and may even obscure, those caused by changes in sample composition. In the limit, such temperature-dependent spectral perturbations may compromise the fidelity of modeling algorithms. Therefore, where the sensor response is the output from one or more sensors 342 that includes a sample spectrum 322', particular embodiments control the temperature of the optical flowcell 22 and the sample flowing therethrough at an application-appropriate temperature, both when the mode of contacting is stopped-flow or continuous-flow, where the temperature is less than about 30° C., less than about 35° C., less than about 40° C., less than about 50° C., less than about 60° C., less than about 80° C., or less than about 100° C., and the temperature control tolerance is less than about ±0.5° C., less than about ±1.0° C., or less than about ±2.0° C.

As discussed above, the sensor response 340 output by a spectrometer 341 is a sample spectrum 322'. The sample spectrum includes intensity values across a defined frequency range and represents the aggregated expression of the of the various functional groups contained in all compounds in the mixture, where the intensities define peaks whose locations are related to the identity of the functional group and the aggregated concentration of the same. It is axiomatic that the properties of a HC mixture are determined by the nature and concentrations of components in the sample mixture. This clearly is true of RVP 310', and it is likewise true of the sample spectrum 322', which can be said to also be a property of the mixture. The output from a soft analyzer model 319 developed for application to a sample spectrum is P'(vapor pressure) as defined in Eq. (2).

In another particular embodiment, the sensor response 340 for a given sample includes the sample spectrum 322' measured with a spectrometer 341 and one or more values for properties selected from the group consisting of but not limited to density, viscosity, refractive index, and temperature measured by corresponding property sensors 343 such as univariate property sensors communicably coupled with the process stream. Representative univariate property sensors for measuring density, viscosity, and refractive index are, respectively, the RotaMASS Coriolis Mass Flow and Density Meter (Rota Yokogawa GmbH & Co. KG, Wehr, Germany), the MIVI Process Viscometer (Sofraser, Villemandeur, France), and the PR-23-RP Process Refractometer (K-Patents, Vantaa, Finland). It should be recognized that in various embodiments, sensor response 340 may include responses that may or may not be univariate responses, for example, those based on ultrasonics, dielectric spectroscopy, and gas chromatography. In yet other particular embodiments, the sensor response 340 is the output from one or more of the aforementioned property sensors 342 excluding the sample spectrum 322' from a spectrometer 341. Moreover, as used herein, the term 'univariate sensor' is intended to encompass conventional density, viscosity, and refractive index sensors, etc., which commonly have integral temperature correction.

Hereinafter, sensor response 340 means generally the output from one or more sensors 342 which may include a sample spectrum 322' from a spectrometer 341; outputs from one or more property sensors 343 including univariate sensors capturing density, viscosity, refractive index, and temperature, and/or a chromatogram from a gas chromatograph. Accordingly, the predicted value for RVP may be expressed as $$P'(RVP)=f(\text{sensor response})=f(\text{sample spectrum},m(1),m(2),m(3),\ldots,m(n),C(HC)) \quad (3)$$

where the function $f$ is the inferential analyzer, which is a model operating on the one or more elements in the sensor response; where $m(1), m(2), m(3), \ldots, m(n)$ are outputs from the one or more other sensors; and where $C(HC)$ is the intensity-versus-time output from a gas chromatogram of the HC mixture. Concerning embodiments where the sensor response is a plurality of elements, nothing herein shall be considered to imply anything about the form in which the elements are configured, arranged, grouped, or represented mathematically, or about whether they are used as issued by the sensor(s) or first are in some way modified or treated by methods known to those skilled in the art. In a particular embodiment, the sensor response 340 is the concatenation of the sample spectrum 322' with output(s) from one or more other property sensors 343.

CQM Functions.

The aforementioned integration of hard and soft analyzers by the CQM involves three activities/functions corresponding to activities depicted in the Figures: Database Acquisition, Model Development, and RVP Measurement. Database 318 acquisition is the process and mechanism for (i) synchronizing the gathering and aggregating responses at 40' of values P(RVP) from hard analyzer 310' and gathering of sensor response 340 for a population of process samples, and (ii) archiving the same. Model development is the creation of a property model 319 through the relating of samples' P(RVP) (hard analyzer) responses 40' and corresponding sensor responses 340 in the database. RVP Measurement is the generation of values P'(RVP) in substantially real time by applying the property model 319 created through model development to the sensor response 340 for a so-called unknown process sample. These are now described in detail with reference to the Figures.

Database Acquisition. Database 318 acquisition begins at the time t(0) when the RVP analyzer 310' sends a signal to the CQM 316' that it has obtained and begun conditioning of a sample for analysis, or alternatively, the CQM 310' sends a signal to the RVP analyzer 310' in response to which the RVP analyzer obtains and begins conditioning a sample for analysis. In a particular embodiment, the CQM 316' sends a signal to the spectrometer 341 at the time t(0) to acquire the sample spectrum 322' of the sample in the process stream interface 22. The RVP analyzer 310' obtains and analyzes samples with a frequency corresponding to a fixed measurement cycle time t(RVP), which typically has a value of between about 4 minutes and 10 minutes. The time required for spectral acquisition, t(spectrum), is set by taking into consideration factors known to those skilled in the art, but typically is between about 0.2 minutes and 2.0 minutes in the case of most process spectrometers, but may be as much as about 4 minutes to about 10 minutes for the PI-200. Except for the latter, the ratio t(RVP)/t(spectrum) is about 2 to 20 with a ratio of about 5 to 16 being representative for typical t(RVP) values of about 5 to 8 minutes and for typical t(spectrum) values of about 30 to 60 s. Upon completing the acquisition by the spectrometer 341 of the sample spectrum and the completing of the RVP measurement by the RVP analyzer 310', the CQM receives and archives both together in database 318 with the value of t(0), which is the time that the spectrometer and the RVP analyzer obtained the sample.

The integrity of the sample database 318 depends on all data archived for each sample being acquired on the same physical sample of the process stream or on physical subsamples thereof that are substantially identical to the process stream. Accordingly, the one or more sensors 342 used to generate the sensor response 340 should be communicably coupled to a sample of the process stream that is temporally and spatially proximate to that acquired and analyzed by the RVP analyzer 310'. Strategies for synchronizing sampling by the RVP analyzer and the spectrometer have been discussed hereinabove. But one skilled in the art will recognize the possibility that acquisition of a sensor response 340 that is or includes a sample spectrum 322' may not need to be precisely synchronized with the obtaining of the sample by the RVP analyzer 310' if changes in sample composition on the time scale of t(spectrum) are inconsequential. In such a case, the sensor response 340 may simply use the sample spectrum corresponding most closely to the time that sample is obtained by the RVP analyzer 310'. Synchronization with a reading or readings from other, univariate sensor(s) is trivial because they are available substantially in real time, with selectable measurement intervals being as low as about 1 s to 10 s, longer intervals being available as well.

Database Acquisition at Fixed Intervals. In particular embodiments, the RVP analyzer 310' obtains, conditions, and analyzes RVP for the sample with a total cycle time of t(RVP) while results are received and archived to database 318 by the CQM 316' on an interval t(i) that is a fixed integer multiple "n" of t(RVP). Thus, t(i) has a minimum value of t(RVP) while other values may be equal to 2×t(RVP), 3×t(RVP), 4×t(RVP), and so forth. In commercial RVP analyzers, whose cycle times range from about 4 minutes to about 10 minutes, the value for t(i) may be less than about 15 minutes, less than about 20 minutes, less than about 30 minutes, less than about 45 minutes, less than about 60 minutes, less than about 2 hours, less than about 4 hours, less than about 8 hours, less than about 12 hours, and less than about 24 hours. The CQM 316' is configured to acquire a next sensor response 340 corresponding to the time t(0)+t(i) at which the RVP analyzer 310' obtains a sample. The CQM 316' then receives the measured RVP value and archives it in database 318 with the sensor response 340 at the time t(0)+t(i). Database 318 development continues with the obtaining of sample by the RVP analyzer 310' and the spectrometer 341 at times determined by the value of t(i) and the subsequent receiving and archival at 318 by the CQM 316' of corresponding sensor responses 340, RVP values (RVP response) 40', and sampling times. It will be understood that the database development strategy just described is offered as a non-limiting example, and that other scenarios may be devised for populating the correlation database with fixed-interval data. For example, the CQM 316' may be configured to direct an RVP analyzer 310', a spectrometer 341, and/or a gas chromatograph to periodically obtain sample data while corresponding values from univariate sensors are available substantially instantaneously.

Sample Data Acquisition at Variable Intervals. For purposes of developing property models 319 with the greatest possible robustness, samples represented in the database should span a range of property values and of sample composition that (i) correspond to those of samples to which the model will be applied, and (ii) are sufficiently diverse such that the application of multivariate modeling methods yields correlations that are statistically robust. Therefore, the objective in database development is not merely to amass data for a large number of samples, which could occur when t(i) is relatively small. Consider that when time scales for process variations are relatively long compared with t(RVP), the likelihood is low that either the stream composition or RVP values will vary significantly between consecutive samples. Consequently, many redundant samples would accrue if the database were developed using consecutive samples.

Therefore, in other particular embodiments, CQM 316' selects samples for which data will be archived on the basis of criteria other than time. Doing so depends on the RVP analyzer 310' and the spectrometer 341 operating continuously and making measurements with total cycle times of t(RVP) and t(spectrum), respectively, without the obtaining of sample by each being synchronized. The CQM receives the outputs as they become available from the RVP analyzer and the spectrometer, then determines when to command the obtaining of a sample by each, the determining being based on methods capable of detecting one or more statistically significant events selected from a group consisting of: (a) a significant change in RVP values 40' among consecutive measurements in some defined time frame; (b) an RVP value 40' that is near the limits of or outside of the range spanned by the current database 318; (c) a significant change in sensor responses 340 among consecutive samples acquired in some defined time frame; (d) a sensor response 340 that is an outlier compared with sensor responses for samples in the current database 318; (e) a significant change in process conditions in some time frame, assessed in terms of changes in process parameters including but not limited to pressure, temperature, and flow; and (f) process conditions at a particular moment that represent an outlier compared with those corresponding to samples in the current database. One skilled in the art also will recognize the possibility to optionally define an aggregate response 42 for a given sample by combining its RVP value 40' and its sensor response 340, and to therewith define two other statistically significant events: (g) a significant change in aggregate responses 42 among consecutive samples acquired in some defined time frame; and (h) an aggregate response 42 that is an outlier compared with aggregated responses 42 for samples in the current database 318. The detection of statistically significant events (a)-(h) may be accomplished using methods known to those skilled in the art, where (a) and (b) may in general be detected by applying univariate statistical methods including but not limited to those employed for statistical quality control (SQC); and where detecting events (c)-(h) may be accomplished by pattern recognition methods or multivariate statistical methods including but not limited to principal component analysis (PCA), hierarchical cluster analysis (HCA), topological analysis, and the like.

Sample Data Acquisition at Intervals Fixed and Variable. Configuring the CQM to acquire data for samples at intervals that are both fixed and variable may be desirable. For example, a process might be so stable for a long time frame of between about 1 hour and 12 hours that the criteria for Sample Data Acquisition at Variable Intervals might not select a sample. Therefore, in another embodiment of the present invention, the CQM is configured to acquire sample data at variable intervals as described hereinabove and also acquire sample data on command within some predetermined time interval t(i) that is less than about 1 hour, less than about 2 hours, about 4 hours, less than about 8 hours, or less than about 12 hours. In yet another particular embodiment, after a certain sample is selected for inclusion in the database, then data for a second, subsequent sample is also archived, where the second sample is that which follows immediately by an interval t(i)=t(RVP). This approach may also be combined with the fixed approach when t(i) is equal to or greater than 2×t(RVP). As has been established already, the RVP value and the sensor response for the second sample likely will substantially identical to those for the sample that immediately precedes it, effectively generating a first data set and a redundant second data set. This offers two benefits that will be readily recognized by those skilled in the art. First, the near-identity of consecutive samples permits the definition statistical criteria for repeatability, which in turn permits the validation of a sample pair or their rejection when those criteria are not satisfied. The same statistic provides a useful estimate of repeatability, both for RVP measured by the hard analyzer and for RVP values predicted in the context of model development and of ongoing RVP measurement. Second, the redundant sample set can be used to validate PCA models that are developed with the first set and used subsequently by the CQM to select variable-interval samples for inclusion in the database.

In connection with the prediction supply chain depicted in FIG. 2, the fidelity of property predictions by soft analyzers depends implicitly on the quality of the sample database, which depends in turn on the range of chemical characteristics and properties of the population of process samples, and also on the quality of the corresponding PTMRs and sensor responses. That dependence may be particularly acute for RVP where variations in concentrations of lighter compounds in a mixture, which have the greatest impact on RVP variation, do not express themselves distinctly in the sensor response 340, as is typical in sample spectra (i.e., from spectrometer 341). Therefore, embodiments of the present invention that govern database acquisition represent novel and non-obvious means for maximizing the quality of the data and also the integrity of the spatial and temporal relationship between P(RVP) values 40' and sensor responses 340.

Initial Model Development. When database 318 acquisition has yielded a sample set whose diversity in RVP values 40' and sample chemistry are representative of the process stream, the sample set is used in initial model development to create a model 319 that outputs a predicted value for RVP, P'(RVP), when applied to the sensor response 340 measured for a new sample. The means and methods for creation of such a model 319 are known by those skilled in the art, where the model is, by way of nonlimiting example, a correlation, a simple linear regression model (LRM), a multilinear regression (MLR), a classical least squares (CLS) model, an inverse least squares (ILS) model, a multivariate statistical model, a partial least squares (PLS) model, principal component regression (PCR) model, a topological model, a neural network, a mathematical algorithm, or a combination of thereof, for example, by means of hierarchical cluster analysis (HCA) that employs PCA and a regression algorithm such as PLS.

In particular embodiments, the model 319 is generated and applied by means of the partial least squares (PLS) algorithm that correlates known RVP values 40' in a population of calibration samples to sensor responses 340 corresponding to each of the calibration samples. In another particular embodiment, the model 319 is a plurality of models created to span subsets of samples in the database so as to generate predictions of P'(RVP) that are more accurate than would be obtained from a single model spanning the entire database. And in yet another embodiment, the model 319 employs a topological algorithm that predicts values P'(RVP) for a so-called unknown sample by an on-the-fly process consisting of (i) selecting database 318 samples whose sensor responses 340 are related most closely to the sensor response of the unknown sample; (ii) using the same to generate a customized model 319'; and (iii) applying the customized model 319' to the unknown sample to generate a value for P'(RVP).

RVP Measurement. A model 319 generated through initial model development as discussed hereinabove now is ready for implementation by the CQM 316' for real-time measurement of RVP. In various embodiments, the implementation procedure relates substantially directly to that procedure used in database development and therefore will not be described in detail.

Sensor Response Acquisition.

The CQM is configured to receive the sensor response 340, which is the same output from the one or more sensors 342 used in model development and which is obtained in a manner that is substantially identical to that used in database 318 development. When based on the output of a plurality of sensors, which by definition excludes the hard analyzer 310' used to measure RVP, readings by those sensors may be synchronized as appropriate and the sensor response is configured in the same fashion as it was for model development.

RVP Prediction: Soft Analyzer.

The CQM 316' then applies the property model 319 to the sensor response 340 to obtain initial predictions for R'(RVP) in accordance with Eq. (3). In embodiments where the sensor response 340 includes outputs from a plurality of sensors 342 that includes a spectrometer 341, prediction frequency is determined by the value of t(spectrum), which is substantially real-time. Prediction frequency is higher still when the sensor response 340 includes one or more measurements from the group consisting of density, viscosity, refractive index, and temperature, e.g., obtained using univariate sensors.

RVP Measurement: Hard Analyzer.

All the while the soft analyzer 312' issues the values R'(RVP), the hard analyzer 310' measures values P(RVP) with a frequency determined by t(RVP).

RVP Measurement: CQM.

One skilled in the art, in view of the instant disclosure, will recognize that the application of the property model 319 by the CQM 316' may be performed in the same manner as that of conventional soft analyzers. But an inventive aspect of the instant invention is the performance by the CQM of three functions to effect the aforementioned integration of the hard and soft analyzers to generate outputs for RVP that represent the strengths of both and the mitigation of their weaknesses, and which may properly be regarded as measurements and not merely predictions.

1. Validation.

Beneficially, the accuracy and robustness of RVP predictions by initial models created in accordance with embodiments described herein may be improved relative to those made by conventional approaches such as inferential spectrometry, the improvement being due in part to the close proximity in space and time of P(RVP) values 40' and sensor responses 340 for samples used in model development. Yet, the fidelity of those predictions ultimately degrades for reasons explained. An initial step in addressing the limitations of RVP prediction using a soft analyzer is ongoing, substantially real-time prediction validation to confirm that prediction fidelity either remains at acceptable or is faltering.

In particular embodiments, validation employs common univariate SQC techniques suitable for quantifying the level of agreement for data pairs. For example, the comparison of consecutive values for P(RVP) 40' or P'(RVP) 340 provides a statistical framework for detecting transient outliers that are due to irregularities in the process, sampling, or measurement. Similarly, the application of SQC techniques to data pairs [P(RVP), P'(RVP)] can reveal the accuracy of individual RVP predictions P'(RVP) or, more critically, short- and long-term deviations of P'(RVP) from P(RVP). A short-term deviation, which is a short-duration offset of P'(RVP) relative to P(RVP) that disappears after a relatively short time, may signal that transient sample chemistry is not well-represented by the model, and therefore in the sample database. By contrast, a long-term deviation that persists is not a transient offset but a statistical bias and may signal that the chemistry of the process stream has changed systematically compared with samples in the database used for model development.

In particular embodiments where at least one element of the sensor response 340 is the sample spectrum 322', the sensor response 340 or the aggregate response 42 for a given sample can be validated against sensor responses 340 or aggregate responses 42, respectively, for samples in the database using techniques discussed hereinabove. Such an approach is the multivariate analog of the simpler SQC methods described in the preceding embodiment and, although it may in some cases have greater sensitivity toward process changes, the univariate and multivariate approaches likely are complementary, each having diagnostic value that may vary according to context.

2. Automatic Model Updating.

Data received by the CQM 316' for routine prediction of P'(RVP) by soft analyzer 312' normally is not archived. But in particular embodiments the CQM 316' is configured to archive data for new samples determined to be unusual on the basis of validation activities or of criteria that governed initial database development, which new samples may then be used subsequently for model updating. In a particular embodiment, the archiving facilitates database 318 expansion whereby samples not represented in the current sample database are added to the same. In another particular embodiment, the archiving is database advancement, advancement being understood in temporal terms with the newest samples displacing the oldest so as to ensure currency of the database with respect to the prevailing process conditions. In database expansion, the underlying presupposition is that samples used in initial model development did not thoroughly span the full range of RVP values or sample composition that might be exhibited in the process. By contrast, the rationale for database advancement is that the process, and therefore the process stream, can change across relatively long time frames in a way that affects the relationship between the sensor response 340 and P(RVP) 40'. Thus, in database expansion, data for new samples are added and that for extant samples is retained while database advancement involves replacement of the oldest samples with new, the latter being deemed as having greater relevance to the current process and process stream. In another particular embodiment, database updating is database advancement where the criteria for sample displacement is both sample age and the multivariate relationship between the aggregate response of samples in the database, the objective being to ensure sample relevance and sample currency while minimizing redundancy amongst samples in the database. The database 318 may be updated simply by writing the new data and deleting the old data using any of various conventional approaches well known by those skilled in the art.

In particular embodiments, database 318 updating is the precondition for model 319 updating. After initial model development, in light of the teachings hereof, one skilled in the art may straightforwardly implement the applicable modeling parameters for automated execution by the CQM 316'. Thus, a particular embodiment of the present invention pairs automated database development with automated model development to confer the CQM 316' with the capability for dynamic, ongoing RVP model 319 updating.

3. Improved Accuracy in RVP Measurement.

The prediction validation and automatic model updating functions of the instant invention represent the fusion of hard and soft analyzer technologies to overcome the limitations and exploit the benefits of both in connection with RVP measurement. By way of abbreviated review, a benefit of the automated, online application of the PTM (by hard analyzers) is that it performs the actual, first-principles measurement of RVP while two main limitations of conventional approaches are relatively long analysis cycle times and results hysteresis. Inferential techniques (by soft analyzers) overcome these limitations by offering substantially real-time predictions but conventional approaches also suffer from (i) lack of ongoing prediction robustness across changing process conditions, the latter altering the relationship between stream composition and RVP; (ii) resultant uncertainty at any given moment about the validity of a given prediction; and (iii) the requirement to periodically update models to maintain acceptable prediction accuracy over time. The third function of the CQM 316' builds on prediction validation and automated model updating to provide accuracy in RVP measurement that far exceeds that of the conventional PTM in many applications.

Note first the assertion in the preceding sentence that the CQM measures rather than merely predicts RVP. The fact that in various embodiments the CQM provides continuous validation in combination with automatic model updating means that at any given instant, the accuracy of P'(RVP) values output by the CQM are bracketed and rigorously qualified by hard measurements of P(RVP). This provides not only the validation of P'(RVP) values generated at time intervals equal to t(RVP), but also the intervening prediction(s) of P'(RVP) made at times t(x) betwixt consecutive P(RVP) measurements, e.g., at intervals that are smaller than t(RVP). Additionally, values for P'(RVP) exhibit a time lag of only t(spectrum) whereas the reporting of values P(RVP) by the hard analyzer lags the actual process by a time interval equal to t(RVP). As discussed hereinabove, t(spectrum) is far less than t(RVP) in many applications. Moreover, in particular embodiments, validation may include comparing consecutive values of P(RVP) with P'(RVP) to detect and remove transient outliers, to generate an enhanced inferred RVP value (P"(RVP)) for the fluid process stream.

A significant, additional improvement in measurement accuracy in particular embodiments derives from the aforementioned filtering of imprecisions in database values for models generated by regression techniques. In particular, PLS-based models have been shown capable of predicting property values with an uncertainty that is less than 20% of the uncertainty in the PTM (Trygstad, et al., ISA 2015). ASTM D323 defines the reproducibility for laboratory-based RVP analyzers as ±0.15 pounds per square inch (psi). Their online counterparts are engineered to automatically sample and analyze process streams but typically share the same core technology. Although measurement reproducibility is ostensibly the same, the common experience of refiners is that in blending operations, they do not achieve so-called ASTM reproducibility. Rather, the actual uncertainty in online RVP measurement may be somewhat larger for reasons elaborated upon hereinabove.

Though the threefold benefit just described is significant and substantial, disparity between P(RVP) 40' and P'(RVP) generated by soft analyzer 312' may be reconciled by methods that are simple, expedient, and efficacious in the short term though they lack the rigor required to deliver long-term robustness. For example, in certain embodiments values for P(RVP) measured by the hard analyzer 310' over some defined time frame may be compared with corresponding values for P'(RVP) to determine and apply a bias correction. In particular embodiments, the fixed time frame is less than about 8 hours, less than about 16 hours, less than about 24 hours, less than about 48 hours, less than about 72 hours, and less than about 96 hours. If the time frame is fixed but advances in time with the successive, new determinations of P(RVP) and P'(RVP), then the application of the bias to successive values of P'(RVP) may yield results that are nominally accurate relative to P(RVP). But if, over yet longer time frames, the sign of such biases is not variable and its absolute value is nominally constant or increases, such a condition suggests a systematic error in the model that will be substantiated through one or more validation functions of the CQM described hereinabove. The present inventor has discovered that ongoing prediction reliability ultimately depends on model updating rather than mere result biasing.

RVP Giveaway.

Certifying that RVP for a blended batch of gasoline does not exceed some defined specification limit commonly involves testing of a single laboratory sample that is the composite of multiple samples acquired during the blending process. Because the composite sample is tested after the fact, it provides no information that can be used to continuously control RVP real-time during blending. Such control depends on factors including (i) uncertainty for the online measurement of RVP values input into the blending control system, and (ii) control by the latter of flow rates of blending components used to produce the finished gasoline product. The difference between the RVP specification limit and the actual RVP of the blend is referred to commonly as RVP giveaway because, for reasons well understood to those knowledgeable in the art of gasoline blending, the cost to produce higher-RVP gasoline is lower than that for lower-RVP gasoline. Effectively, the refiner gives away profits in proportion to the difference between the shall-not-exceed specification limit for RVP and the actual RVP of the blended product.

RVP Giveway Reduction.

In consideration of uncertainty in RVP measurement only, the blending setpoint or target value for RVP during gasoline blending may be represented by way of nonlimiting example as,

[RVP setpoint]=[maximum RVP limit for product]-[2×$U$(RVP)]     (4)

And as defined hereinabove, $$RVP \text{ giveaway} = [\text{maximum } RVP \text{ limit for product}] - [RVP \text{ setpoint}]$$
$$= 2 \times U(RVP) \quad \text{Eq. (5)}$$

where U(RVP) is the uncertainty in RVP measurement at the 95% confidence level (CL). For example, if U(RVP)=±0.25 psi, RVP Giveaway=0.5. An 80% reduction in RVP measurement uncertainty to U(RVP)=±0.05 reduces RVP giveaway by 0.5 psi-2×(0.05 psi)=0.4 psi, and the new RVP setpoint value is now 0.1 psi below [maximum RVP limit for product]. For a refinery whose crude processing capacity is equal to the median value in the United States of about 125,000 barrels per day (bpd), the value of that RVP giveaway reduction may, by way of nonlimiting example, be calculated according to Eq. (6).

0.4×0.45×125,000×365×$1.00=$8.2 million per year     (6)

where $1.00 represents the value of an RVP-barrel and the average gasoline yield in barrels per barrel crude is 0.45 in North America. The factor for converting pressure units psi to kPa is 0.145038. Thus, 0.145038×kPa=psi and psi/0.145038=kPa     (7)

In an actual gasoline blending operation, control of RVP is a function of a number of additional uncertainties including but not limited to the fidelity of blending models, the knowledge of properties of the blending components, and the ability to measure and control other properties that affect RVP. These uncertainties combine in a non-additive fashion. Nevertheless, uncertainty in RVP measurement infuses the blending operation generally and has predominant influence on the control of RVP. Accordingly, the reduction in RVP giveaway given by Eq. (6) is representative of the benefit of improved accuracy in RVP measurement that accrues through the instant invention, the total value scaling in proportion to a given refinery's crude processing capacity. Thus, the typical annual profit improvement for a refinery that processes 60,000 bpd crude oil would be about $3.9 million while that for a 250,000 bpd refinery would be $16.4 million.

Despite the significant potential return on investment in a gasoline blending operation, a refiner nevertheless may not be able to justify the purchase and installation of embodiments of the instant invention for the sole purpose of reducing RVP giveaway. But the required justification may accrue where the refiner also seeks to leverage inferential spectrometry to measure other motor fuel properties such as octane number in gasoline. Thus, significant value of the present invention may be realized when a hard, online RVP analyzer is already installed and octane analysis is being performed by inferential spectrometry using gasoline spectra measured by a molecular spectroscopy technique, for example, by an online FTIR, NIR, Raman, or NMR spectrometer. Alternatively, if only a spectrometer or only an RVP analyzer is already installed for online gasoline monitoring, the other can be acquired and CQM implemented to integrate the two for enhanced RVP measurement according to the present invention. A refiner with neither an online spectrometer nor an online RVP analyzer may justify the purchase of both on the basis of reduction in RVP giveaway alone while deriving additional benefits from the application of inferential spectrometry to measure other properties such as octane. In a particular embodiment, the present invention includes an online RVP analyzer, an online HyperFlux P.R.O. Plus Raman spectrometer, and the CQM configured according to embodiments described hereinabove to enable database acquisition, ongoing database updating, and real-time RVP measurement in gasoline blending operations. In yet another particular embodiment, the spectrometer is an FTNIR spectrometer while other particular embodiments employ FTIR or NMR spectrometers.

Alternate Embodiments

Embodiments described hereinabove may be referred to as Embodiments F insofar as they predict P'(RVP) as depicted in Eq. (3), wherein a mathematical function $f$ is applied to a sensor response including one or more elements selected from a group consisting of a sample spectrum and the output from one or more other sensors, and where $f$ signifies that a model relates the sensor response to P(RVP). Thus, the sensor response 340 that is the basis for RVP prediction in so-called unknown process samples includes substantially the same elements as the sensor responses 340 used to create models in accordance with embodiments described in connection with model development. Additionally, as discussed hereinabove, elements of the sensor response 340 are independent variables that correspond to properties that are not P(RVP) 40' measured by the hard analyzer 310' in accordance with some standard method.

In an alternative embodiment, the hard analyzer is configured to obtain vapor pressure by a non-standard method, P(non-standard), and the soft analyzer includes a model that relates a sensor response 340 to RVP values 40' corresponding to those that would be measured by a standard method, P(standard). The non-standard method for measuring vapor pressure is one wherein one or more method parameters deviate from those defined in a standard method such as ASTM D323, and database development includes acquiring and storing the sample values P(non-standard) and one or more property values selected from a group consisting of density, viscosity, refractive index, and temperature. Thus, in such embodiments, $$P'(\text{standard}) = g(\text{sensor response}) \quad \text{Eq. (8)}$$
$$= g(P(\text{non-standard}), m(1), m(2), m(3), \ldots, m(n))$$

For convenience, embodiments described generally by Eq. (8) shall be referred to as Embodiments G. In a particular Embodiment G, the non-standard parameter is the setpoint temperature for analysis and/or the vapor-to-liquid volume in the measurement cell.

In another particular Embodiment G, model development is based on the relating of sample values P(non-standard) to a corresponding sensor response 340, that includes values P(standard), all having been acquired by one of two procedures that are exemplary but nonlimiting. In the first, the aggregate response for calibration samples is acquired in the laboratory by means of (i) a hard analyzer 310' that is an instrument configured to measure P(non-standard), and (ii) property sensors 342, which include the same or different instrument configured to measure P(non-standard), and optionally one or more laboratory instruments configured to measure additional sample responses. In the second, the aggregate response for calibration samples includes (i) P(non-standard) values for samples collected online as described hereinabove for database development; and (ii) response values for one or more property sensors including P(standard) measured in the laboratory on process samples captured automatically online at times synchronized with the obtaining of P(non-standard) values, where methods for such capture are known to those skilled in the art. Data acquired in either of the particular Embodiments G are used to create a mathematical function g, which is a model operating on sensor responses, that predicts P'(standard) as defined hereinabove with a measurement frequency determined by the analysis cycle time of the hard analyzer employed to measure P(non-standard).

In yet another particular embodiment, Embodiments G are applied beneficially to measure RVP in high-paraffin condensates and crudes at an elevated, non-standard temperature to mitigate or eliminate the fouling that occurs in hard RVP analyzers operating at standard temperatures, which fouling is caused by the deposition of paraffins from the process sample.

In yet another alternate embodiment of the instant invention, the hard analyzer is configured to measure values 40' for P(standard) or P(non-standard); the sensor response 340 includes values from an online gas chromatograph (GC) configured to quantify the concentrations of the light hydrocarbon (LH) components in the HC process stream whose role in determining RVP is preponderant; the soft analyzer includes a model 319 that permits calculation of P'(RVP) from a sensor response that includes those components' concentrations; and the HC process stream is crude oil, light crude oil, condensates, distillates, natural gas liquids (NGL), shale oil, and the like. An example of a process GC suitable for use in these embodiments is the GC8000 by Yokogawa Electric Corporation. Thus, in such embodiments, $$P'(RVP) = h(\text{sensor response}) \quad \text{Eq. (9)}$$
$$= h((C(LH)), m(1), m(2), m(3), \ldots, m(n))$$

where C(LH) is the concentration array [c(1), c(2), c(3), ..., c(n)] for the LH components 1, 2, 3, ..., n determined by the gas chromatograph; and the LH components 1, 2, 3, ..., n are methane, ethane, propane, etc., whose role in determining RVP is preponderant; the concentration array may by way of nonlimiting example be a simulated distillation profile generated by means known to those skilled in the art; and the soft sensor h is a model applied to the sensor response. For convenience, embodiments described generally by Eq. (9) shall be referred to as Embodiments H. In particular Embodiments H, database acquisition is a collection of P(RVP) and the sensor response for a population of samples suitable to support model development, the collecting being accomplished by either or two procedures that are exemplary but nonlimiting. One involves acquisition in the laboratory of database values for a set of calibration samples by means of (i) an instrument configured to measure P(RVP); (ii) a GC that measures C(LH); and optionally (iii) instruments that measure m(1), m(2), m(3), ..., m(n), which are the one or more sensor outputs selected from a group consisting of density, viscosity, refractive index, and temperature. In an alternative procedure, C(LH) and the one or more values m(1), m(2), m(3), ..., m(n) are collected online as described hereinabove for database development while values for P(RVP) are measured in the laboratory on process samples captured automatically online at times synchronized with the obtaining of process samples by the hard analyzer that measures C(LH), the methods for such capture being known to those skilled in the art. Having thus acquired a database spanning a range of stream compositions representative of the process, model development for Embodiments H employs one or more approaches consisting of relating (i) the sensor response to P(RVP) by the application of a multivariate modeling technique; (ii) C(LH) to the known vapor pressures of the corresponding LH components under defined conditions such as temperature and pressure through the application of first principles; (iii) variation of those known vapor pressures for the LH components to variation in the composition of the balance of the HC mixture, the latter being determined or approximated by the GC analysis used to obtain C(LH) or by correlation with density and/or viscosity.

In another particular Embodiment H, the GC is a fast GC configured to substantially resolve light HC compounds in a mixture with between 2 and about 10 carbon atoms so as to permit their quantification according to carbon number and also to resolve heavier HC compounds in the same mixture at a level sufficient to quantify distillation yield as a function of temperature and/or carbon number, the analysis being performed with a cycle time of less than about 3 minutes, less than about 4 minutes, and less than about 5 minutes. An example of a fast GC is the Calidus by Falcon Analytical Systems & Technology, LLC (Lewisburg, W.Va.). On the basis of the quantitative sample information obtained in such fashion and corresponding RVP values, one skilled in the art may apply a combination of first principles and empirical correlations to create a model to predict RVP as a function of the concentrations of light hydrocarbons and the distribution of heavier compounds in a HC mixture.

It should be noted that aspects of Embodiments G and H offer some but not necessarily all of the benefits of Embodiments F. For example, they overcome some of the limitations of RVP measurement by a PTM implemented on a hard process analyzer, including maintenance demanded by fouling of the measurement apparatus that may occur when the HC mixture contains high quantities of paraffins that can potentially produce waxy deposits in the RVP analyzer. Furthermore, when the sensor response includes readings from sensors that provide viscosity, density, and refractive index readings that are substantially instantaneous on time scales for hard RVP measurements and process changes, the possibility exists to leverage such readings to generate substantially real-time predictions of P'(RVP). Multivariable methodologies also afford the possibility to validate predictions and provide thereby some level of assurance that they are actionable. Yet, the possibility for ongoing, automated updating of RVP models afforded in Embodiments F is not available in some applications of Embodiments G and H. But the need for such capability is mitigated or largely eliminated because the sensor response in applications of Embodiments G and H are substantially related to P(RVP). Thus, in some Embodiments G, an element of the sensor response is P(non-standard) while C(LH) is an element of the sensor response in Embodiments H. Accordingly, the models may be regarded being "firmer" or "harder" than those in Embodiments F wherein RVP relates to the sensor response circumstantially or very indirectly and the models therefore are very soft. Put differently, models in Embodiments G and H are more robust because RVP is substantially determined by the sensor response whereas those in Embodiments F are not because the sensor response underdetermines RVP. As has been discussed elsewhere, the continuum from hard to circumstantial models exhibits decreasing model robustness and increasing need for model updating (Trygstad et al., ISA 2016).

Particular embodiments of Embodiments F and H offer the possibility to monitor a plurality of process streams by configuring the hard analyzer to receive samples from each by means of stream multiplexing known to those skilled in the art. Normally, the application of a single, conventional, hard RVP analyzer to measure multiple streams is impractical due to the previously-discussed potential for hysteresis in subsequent measurements on samples whose composition and RVP are substantially different. The alternative of installing multiple RVP analyzers to monitor multiple streams may be impractical for financial reasons, but doing so does not overcome the inherent limitations of hard analyzers detailed hereinabove. By contrast, spectroscopy-based inferential monitoring of RVP may be straightforwardly enabled by the common practices of stream multiplexing or optical multiplexing, yet doing so has limited value due to the lack of prediction robustness. But the CQM offers the possibility to mitigate the limitations of stream multiplexing just described for hard and soft analyzers. In a particular embodiment of Embodiment F, the CQM makes predictions while agreement between sequential measurements of a first stream by the hard analyzer stabilizes to within a range signifying statistical equivalence. Thus qualified, the value(s) measured by the hard analyzer may be added to the database for the aggregate response for the first stream. Then the sampling system provides a sample of second stream to the hard analyzer and the process is repeated until each of the streams is analyzed. In another particular embodiment, the gas chromatograph and optional other sensors of Embodiment H sample in turn each of a plurality of streams and apply the model h to generate predictions for RVP.

Many modifications and other embodiments of the inventions set forth herein will come to mind to one skilled in the art to which these inventions pertain having the benefit of the teachings presented in the foregoing descriptions and the associated drawings. For example, it should be recognized that the "models" shown and described herein not only include those based on multivariate statistical methods, e.g. PCA (principal component analysis), PLS (partial least squares), and MLR (multiple linear regression), but also include RBF (radial basis function), neural networks, models based on first principles, and combinations thereof, along with substantially any model types that may be developed in the future. Similarly, although various exemplary analyzer technologies have been shown and described with respect to the various embodiments herein, it should be recognized that other technologies, such as those based on TDL (tunable diode laser), QCL (quantum cascade laser), and CRD (cavity ring-down) spectroscopy, and combinations thereof, along with any future developed analyzer technology, may be used without departing from the scope of the invention. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A system for determining vapor pressure of a hydrocarbon fluid process stream in real time, the system comprising:
   a liquid flow path configured to convey the fluid process stream to at least one process stream interface;
   a hard analyzer including hardware, communicably coupled to the process stream interface, the hard analyzer configured to generate values for vapor pressure of a sample of the fluid process stream at time increments $t1, t2, \ldots tn$;
   one or more sensors communicably coupled to the process stream interface, the one or more sensors configured to generate one or more outputs in a form of independent variables for a sample of the fluid process stream at said time increments;

a cognitive quality manager (CQM) communicably coupled to the hard analyzer and the one or more sensors, the CQM including an aggregation module configured to capture and aggregate the one or more outputs and the values generated by the hard analyzer, to form an aggregated response;

the CQM configured to use the aggregated response to generate a model relating the one or more outputs to the values generated by the hard analyzer;

the CQM configured to apply the model to the one or more outputs to generate a predicted value of vapor pressure of a sample of the fluid process stream at one or more times tx between said time increments; and a distributed control system (DCS) communicably coupled to the CQM, the DCS configured to use said predicted value of vapor pressure of a sample of the fluid process stream at one or more times tx between said time increments to control the fluid process stream in real time.

2. The system of claim 1, wherein the CQM is configured to update the model with the values and the one or more outputs in real time.

3. The system of claim 1, wherein the hard analyzer generates the values for vapor pressure in accordance with a Primary Test Method (PTM).

4. The system of claim 3, wherein the predicted value for RVP (Reid Vapor Pressure) is expressed by:

$$P'(RVP) = f(\text{sensor response}) = f(\text{sample spectrum}, m(1), m(2), m(3), \ldots, m(n), C(HC))$$

where function $f$ is the model; where sample spectrum is the output from a spectrometer; where m(1), m(2), m(3), m(n) are the one or more outputs from the one or more sensors; and where C(HC) is an intensity-versus-time output from a gas chromatogram of the sample.

5. The system of claim 3, wherein the PTM is a Reid Method, to generate a Reid Vapor Pressure (RVP), and the value generated thereby is P(RVP).

6. The system of claim 1, wherein the hard analyzer generates the values for vapor pressure in accordance with a non-standard test method.

7. The system of claim 6, wherein the non-standard method is one wherein one or more parameters deviate from those defined in a Primary Test Method (PTM) and the predicted value for vapor pressure is expressed by:

$$P'(\text{standard}) = g(\text{sensor response})$$
$$= g(P(\text{non-standard}), m(1), m(2), m(3), \ldots, m(n))$$

where function g is the model; and where m(1), m(2), m(3), . . . , m(n) are outputs from the one or more sensors.

8. The system of claim 1, wherein the one or more sensors comprises a spectrometer.

9. The system of claim 1, wherein the one or more sensors is from the group consisting of a spectrometer, a density sensor, a viscosity sensor, a refractive index sensor, and a temperature sensor.

10. The system of claim 9, wherein the spectrometer is from the group consisting of a near-infrared (NIR) spectrometer, a Fourier Transform infrared (FTIR) spectrometer, a Raman spectrometer, and a nuclear magnetic resonance (NMR) spectrometer.

11. The system of claim 1, wherein the CQM is configured to receive and archive the aggregated response in a sample database.

12. The system of claim 11, wherein the database is used for the development of the model.

13. The system of claim 12, where the model is a mathematical model, an algorithm, and/or a multivariate statistical model.

14. The system of claim 1, wherein:
wherein the hard analyzer generates the values for vapor pressure in accordance with a Primary Test Method (PTM);
wherein the PTM is a Reid Method, to generate a Reid Vapor Pressure (RVP), and the value generated thereby is P(RVP);
the aggregation module is further configured to use the P(RVP) and the one or more outputs to form a validated response;
the CQM includes a database populated by the validated response, and a model engine configured to use the database to generate the model; and
the model is configured to generate a predicted value of the RVP (P'(RVP)) for a sample of the fluid process stream at the one or more times tx.

15. The system of claim 14, wherein the CQM is further configured to generate a comparison of consecutive values of P(RVP) with corresponding values of P'(RVP), and to use the comparison to detect and remove transient outliers, to generate an enhanced inferred RVP value (P"(RVP)) for the fluid process stream.

16. The system of claim 15, further comprising a process optimizer configured to use the P'(RVP) and/or P"(RVP) to control the fluid process stream in real time.

17. The system of claim 16, further comprising a process control system operatively engaged with the process optimizer, the process control system configured to adjust one or more parameters of the fluid process stream in response to receipt of instructions from the process optimizer.

18. The system of claim 1, wherein the independent variables include one or more of temperature, refractive index, viscosity, density, intensity responses measured by photometric or spectrometric devices at particular wavelengths or frequencies, a chromatogram from a gas chromatograph, and/or combinations thereof.

19. The system of claim 1, wherein the system is configured to use the one or more outputs and/or values to update the model.

20. The system of claim 15, wherein the comparison includes a validation of at least one of the one or more outputs.

21. The system of claim 20, being configured to adjust the model and/or control the fluid process stream once the one or more outputs are validated.

22. The system of claim 21, being configured to determine whether to use the validated one or more outputs to adjust the model based upon at least one of an age of the validated one or more outputs and a current state of the process as compared to a state of the process at the time the one or more outputs were measured.

23. The system of claim 20, wherein the comparison module is configured to generate the comparison using a statistical multivariate procedure.

24. The system of claim 1, wherein the one or more sensors comprises a gas chromatograph configured to generate the one or more outputs by capturing and evaluating a chromatogram of a sample of the fluid process stream.

25. The system of claim 24, wherein the predicted value for RVP is expressed by:

$$P'(RVP) = h(\text{sensor response})$$
$$= h((C(LH)), m(1), m(2), m(3), \ldots, m(n))$$

where function h is the model; where m(1), m(2), m(3), . . . , m(n) are outputs from the one or more sensors; where C(LH) is a concentration array [c(1), c(2), c(3), . . . , c(n)] for components 1, 2, 3, . . . , n of the sample as determined by the gas chromatograph.

26. The system of claim 15, wherein the CQM is configured to generate the predicted value P'(RVP) and/or P"(RVP) substantially in real time, and the hard analyzer is an online analyzer that generates the values P(RVP) with a frequency that is lower than a frequency with which the predicted value P'(RVP) and/or P"(RVP) is generated, and wherein the comparison is used to adjust the model and/or to control the fluid process stream substantially in real time.

27. The system of claim 1, configured to determine vapor pressure of a plurality of hydrocarbon fluid process streams in real time, the system comprising a plurality of said liquid flow paths and a plurality of said process stream interfaces.

28. A method for determining vapor pressure of a hydrocarbon fluid process stream in real time, the method comprising:
   conveying the fluid process stream through a liquid flow path to at least one process stream interface;
   communicably coupling a hard analyzer including hardware, to the process stream interface, the hard analyzer configured to generate values for vapor pressure of a sample of the fluid process stream at time increments t1, t2, . . . tn;
   communicably coupling one or more sensors to the process stream interface, the one or more sensors configured to generate one or more outputs in a form of independent variables for a sample of the fluid process stream at said time increments;
   communicably coupling a cognitive quality manager (CQM) to the hard analyzer and the one or more sensors, the CQM including an aggregation module configured to capture and aggregate the one or more outputs and the values generated by the hard analyzer, to form an aggregated response;
   with the CQM, using the aggregated response to generate a model relating the one or more outputs to the values generated by the hard analyzer;
   with the CQM, applying the model to the one or more outputs to generate a predicted value of vapor pressure of a sample of the fluid process stream at one or more times tx between said time increments; and
   communicably coupling a distributed control system (DCS) to the CQM, and with the DCS, using the predicted value of vapor pressure of a sample of the fluid process stream at one or more times tx between said time increments to control the fluid process stream in real time.

29. The method of claim 28, further comprising, with the CQM, updating the model with the values and the one or more outputs in real time.

30. The method of claim 28, wherein the hard analyzer generates the values for vapor pressure in accordance with a Primary Test Method (PTM).

31. The method of claim 30, wherein the predicted value for RVP (Reid Vapor Pressure) is expressed by the following:

$$P'(RVP) = f(\text{sensor response}) = f(\text{sample spectrum}, m(1), m(2), m(3), \ldots, m(n), C(HC))$$

where function $f$ is the model; where sample spectrum is the output from a spectrometer; where m(1), m(2), m(3), . . . , m(n) are outputs from the one or more sensors; and where C(HC) is an intensity-versus-time output from a gas chromatogram of the sample.

32. The method of claim 30, wherein the PTM is a Reid Method, to generate a Reid Vapor Pressure (RVP), and the value generated thereby is P(RVP).

33. The method of claim 28, wherein the hard analyzer generates the values for vapor pressure in accordance with a non-standard test method.

34. The method of claim 33, wherein the non-standard method is one wherein one or more parameters deviate from those defined in a Primary Test Method (PTM) and the predicted value for vapor pressure is expressed:

$$P'(\text{standard}) = g(\text{sensor response})$$
$$= g(P(\text{non-standard}), m(1), m(2), m(3), \ldots, m(n))$$

where function g is the model; and where m(1), m(2), m(3), . . . , m(n) are outputs from the one or more sensors.

35. The method of claim 28, wherein the one or more sensors comprises a spectrometer.

36. The method of claim 28, wherein the one or more sensors is from the group consisting of a spectrometer, a density sensor, a viscosity sensor, a refractive index sensor, and a temperature sensor.

37. The method of claim 36, wherein the spectrometer is from the group consisting of a near-infrared (NIR) spectrometer, a Fourier Transform infrared (FTIR) spectrometer, a Raman spectrometer, and a nuclear magnetic resonance (NMR) spectrometer.

38. The method of claim 28, further comprising, with the CQM, receiving and archiving the aggregated response in a sample database.

39. The method of claim 38, wherein the database is used for the development of the model.

40. The method of claim 39, where the model is a mathematical model, an algorithm, and/or a multivariate statistical model.

41. The method of claim 28, further comprising:
   wherein the hard analyzer generates the values for vapor pressure in accordance with a Primary Test Method (PTM);
   wherein the PTM is a Reid Method, to generate a Reid Vapor Pressure (RVP), and the value generated thereby is P(RVP);
   with the aggregation module, using the P(RVP) and the one or more outputs to form a validated response;
   with the CQM, populating a database with the validated response, and with a model engine, using the database to generate the model; and
   with the model, generating a predicted value of the RVP (P'(RVP)) for a sample of the fluid process stream at the one or more times tx.

42. The method of claim 41, further comprising using the CQM to generate a comparison of consecutive values of P(RVP) with corresponding values of P'(RVP), and to use the comparison to detect and remove transient outliers, to generate an enhanced inferred RVP value (P"(RVP)) for the fluid process stream.

43. The method of claim 42, further comprising using a process optimizer to use the P'(RVP) and/or P"(RVP) to control the fluid process stream in real time.

44. The method of claim 43, further comprising operatively engaging a process control system with the process optimizer to adjust one or more parameters of the fluid process stream in response to receipt of instructions from the process optimizer.

45. The method of claim 28, wherein the independent variables include one or more of temperature, refractive index, viscosity, density, intensity responses measured by photometric or spectrometric devices at particular wavelengths or frequencies, a chromatogram from a gas chromatograph, and/or combinations thereof.

46. The method of claim 28, further comprising using the one or more outputs and/or values to update the model.

47. The method of claim 42, wherein the comparison includes a validation of at least one of the one or more outputs.

48. The method of claim 47, further comprising adjusting the model and/or control the fluid process stream once the one or more outputs are validated.

49. The method of claim 48, further comprising determining whether to use the validated one or more outputs to adjust the model based upon at least one of an age of the validated one or more outputs and a current state of the process as compared to a state of the process at the time the one or more outputs were measured.

50. The method of claim 47, further comprising using the comparison module to generate the comparison using a statistical multivariate procedure.

51. The method of claim 28, wherein the one or more sensors comprises a gas chromatograph configured to generate the one or more outputs by capturing and evaluating a chromatogram of a sample of the fluid process stream.

52. The method of claim 51, wherein the predicted value for RVP is expressed by:

$$P'(RVP) = h(\text{sensor response})$$
$$= h((C(LH)), m(1), m(2), m(3), \ldots, m(n))$$

where function h is the model; where m(1), m(2), m(3), ..., m(n) are outputs from the one or more sensors; where C(LH) is a concentration array [c(1), c(2), c(3), ..., c(n)] for components 1, 2, 3, ..., n of the sample as determined by the gas chromatograph.

53. The method of claim 42, further comprising, with the CQM, generating the predicted value P'(RVP) and/or P"(RVP) substantially in real time, and the hard analyzer is an online analyzer that generates the values P(RVP) with a frequency that is lower than a frequency with which the predicted value P'(RVP) and/or P"(RVP) is generated, and wherein the comparison is used to adjust the model and/or to control the fluid process stream substantially in real time.

54. The method of claim 28, further comprising determining vapor pressure of a plurality of hydrocarbon fluid process streams in real time, with a plurality of said liquid flow paths and a plurality of said process stream interfaces.

* * * * *